United States Patent
Vercammen et al.

(10) Patent No.: US 6,544,889 B2
(45) Date of Patent: Apr. 8, 2003

(54) METHOD FOR TUNGSTEN CHEMICAL VAPOR DEPOSITION ON A SEMICONDUCTOR SUBSTRATE

(75) Inventors: Hans Vercammen, Kruibeke (BE); Joris Baele, Belsele (BE)

(73) Assignee: AMI Semiconductor Belgium BVBA, Oudenaarde (BE)

( * ) Notice: Subject to any disclaimer, the term of this patent is extended or adjusted under 35 U.S.C. 154(b) by 0 days.

(21) Appl. No.: 09/768,151

(22) Filed: Jan. 24, 2001

(65) Prior Publication Data

US 2002/0086110 A1 Jul. 4, 2002

(30) Foreign Application Priority Data

Dec. 28, 2000 (EP) .............................. 00403705

(51) Int. Cl.⁷ .............................. C23C 16/08
(52) U.S. Cl. .................. 438/680; 438/685; 427/99; 427/253
(58) Field of Search .................. 427/99, 253; 438/680, 438/685

(56) References Cited

U.S. PATENT DOCUMENTS

| | | | | |
|---|---|---|---|---|
| 4,629,635 A | * | 12/1986 | Brors | .................. 427/255.393 |
| 5,028,565 A | | 7/1991 | Chang et al. | |
| 5,407,698 A | * | 4/1995 | Emesh | .................. 427/250 |
| 5,795,824 A | | 8/1998 | Hancock | |
| 6,162,715 A | | 12/2000 | Mak et al. | |

FOREIGN PATENT DOCUMENTS

EP      0 486 927 A1      5/1992

OTHER PUBLICATIONS

"Studies on the nucleation and growth of chemical–vapor–deposited W on TiN substrates", by Eui Song Kim et al., Materials Science and Engineering, B17 (1993), pp. 137–142.

"Step coverage prediction during blanket :PCVD tungsten deposition from hydrogen, silane and tungsten hexaflouride", by Carol M. McConica et al., Proceedings of the V–Mic Conference, Jun. 13–14, 1988, pp. 268–276, Session VII: VSSI Multilevel Interconnection Dielectric Systems.

"Chemical vapor deposition of Tungsten step coverage and thickness uniformity experiments", by J. C. Chang, Thin Solid Films, CH, Elsevier–Sequoia S. A. Lausanne, vol. 208, No. 2, Feb. 28, 1992, pp. 177–180, XP000261812.

"The Adhesion of low pressure chemically Vapour Deposited Tungsten Films on Silicom and SIO2 for SIH4–H2–WF2 and H2–WF6 Processes", Thin Solid Films, CH., Elsevier–Sequoia S. A. Lausanne, vol. 201, No. 1, Jun. 5, 1991, pp. 167–174, XP000232794, ISSN: 0040–6090.

\* cited by examiner

Primary Examiner—Timothy Meeks
(74) Attorney, Agent, or Firm—Sughrue Mion, PLLC

(57) ABSTRACT

This invention relates to a method for tungsten chemical vapor deposition on a semiconductor substrate, comprising positioning said substrate within a deposition chamber, heating said substrate and depositing under low pressure the tungsten on the substrate by contacting the latter with a mixture of gases flowing through the deposition chamber comprising tungsten hexafluoride ($WF_6$), hydrogen ($H_2$) and at least one carrier gas. The mixture of gases comprises also silane ($SiH_4$) with such a flow rate that the flow ratio $WF_6/SiH_4$ is from 2.5 to 6, the flow rate of $WF_6$ being from 30 to 60 sccm, while the pressure in the deposition chamber is maintained from 0.13 to 5.33 kPa (1 and 40 Torr).

5 Claims, 5 Drawing Sheets

METHOD FOR TUNGSTEN CHEMICAL VAPOR DEPOSITION ON A SEMICONDUCTOR SUBSTRATE

BACKGROUND OF THE INVENTION

This invention relates to a method for chemical vapor deposition of a layer of tungsten (W) on a semiconductor substrate.

The chemical vapor deposition of tungsten on a semiconductor substrate, such as a silicon oxide wafer which may have portions of an integrated circuit structure already formed therein, such as, for example one or more transistors, is an integral part of most semiconductor fabrication processes.

An insulating layer, mostly a silicon oxide layer has usually been formed over this substrate and has been previously patterned to provide openings or vias to underlying portions of the integrated circuit structure.

Chemical vapor deposited W has been used as a conducting material to fill contact holes or via holes. The tungsten layer covers the complete substrate surface and is then etched or polished away, except from the holes.

Since a tungsten layer cannot be deposited by chemical vapor deposition directly on a silicon oxide layer, an intermediate layer with a good adhesion for both the insulating layer and tungsten, for instance a titanium nitride (TiN) layer on top of titanium is deposited.

The tungsten is usually deposited through the reduction of tungsten hexafluoride (WF6) in a two-steps process. The steps are different in pressure set points and used reductor, being in the first step mainly silane ($SiH_4$) and then hydrogen ($H_2$) only. The largest part of the film is deposited by $H_2$ reduction.

U.S. Pat. No. 5,028,565 of APPLIED MATERIALS, Inc., Santa Clara, Calif., LISA, discloses such method wherein tungsten is deposited on a wafer heated from about 350 to about 525° C. in a vacuum chamber wherein the pressure is maintained from 2.67 to 101.32 kPa (from about 20 to about 760 Torr). A combination is used of $WF_6$ gas, an inert carrier gas such as Ar, nitrogen and hydrogen. The flow rate of $WF_6$ is from about 20 to about 200 standard cubic centimeters per minute (hereafter abbreviated as sccm). The flow rate of the inert carrier Ar is from about 100 to about 5000 sccm, and the flow rate of nitrogen is from about 10 to about 300 sccm. The hydrogen flow rate is from about 300 to about 3000 sccm.

The $N_2$ in the gas mixture has been found to increase the reflectivity of the deposited layer which facilitates the use of photolitography in a subsequent patterning step, and to decrease the surface roughness.

U.S. Pat. No. 5,028,565 discloses however also that, especially when the intermediate layer is titanium nitride, it is important to form first a nucleation layer with from about 5 to about 50 sccm of $WF_6$, from about 5 to about 50 sccm silane ($SiH_4$), from about 500 to about 3000 sccm of Ar and from about 20 to about 300 sccm of $N_2$.

It has been found that, without the nucleation layer, the tungsten layer was not uniform in thickness and resistivity.

Literature unanimously confirms the impossibility to obtain a tungsten film with good qualities, especially a good step coverage, a good layer uniformity and a low via resistance, without these two steps. The step coverage is the ratio of the thickness of the tungsten film at the side wall at half depth of the trench or contact hole and the nominal tungsten film thickness or the thickness of top layer.

EUI SONG KIM et al. for instance mention in their article "Studies on the nucleation and growth of chemical-vapor-deposited W on TiN substrates", published in MATERIALS SCIENCE AND ENGINEERING, B 17 (1993) 137–142, that since it is not easy to nucleate W on TiN by $H_2$ reduction of $WF_6$, it is now common to initiate nucleation of W by $SiH_4$ reduction first and then grow W film to the required thickness by $H_2$ reduction.

CAROL M. McCONICA et al., also mention in their article "Step coverage prediction during blanket LPCVD tungsten deposition from hydrogen, silane and tungsten hexafluoride", published in the Proceedings of the V-Mic Conference of Jun. 13–14, 1988, pages 268–276, Session VII: "VSSI Multilevel Interconnection Dielectric Systems", that the reduction with $SiH_4$ or a mixture of $SiH_4$ and $H_2$ offers many advantages over the reduction by $H_2$ alone, such as smaller temperature dependency in the growth rate, more uniform films and a larger growth rate, but that the major disadvantage of $SiH_4$ is the limited step coverage, in comparison to the hydrogen reduction.

A. HASPER et al. In "W-LPCVD step coverage and modeling in trenches and contact holes", Proceedings of the workshop on tungsten and other refractory metals for VLSI/ USII applications V, 127 (1990) S. S. WONG and S. FURUKAWA ed., Materials Research Society, Pittsburg Pa., USA, mention also that the reduction with $SiH_4$ offers many advantages like a high and temperature independent growth rate, a smaller grain size and has less interaction with silicon, but also that, when $SiH_4$ is added to a $WF_6/H_2$ mixture, the step coverage drops.

In general, the hydrogen reduction gives better step coverage than the silane reduction, but the deposition rate of the hydrogen reduction method is significantly lower. Consequently, the second step in the tungsten deposition is therefore without $SiH_4$ as in the actual method recommended by the above mentioned company APPLIED MATERIALS, INC.

This method comprises a soak step with $SiH_4$, to saturate and passivate the underlying layer, a nucleation step at a pressure of 4.00 kPa (30 Torr), wherein 30 sccm $WF_6$ is reduced by means of a mixture of 1000 sccm H2 and $SiH_4$ in a flow ratio $WF_6/SiH_4$ of 2, and a bulk deposition step at a second pressure of 12.00 kPa (90 Torr) wherein sccm $WF_6$ is reduced by means of 700 sccm $H_2$ alone. The wafer is heated to 475° C. during the tungsten deposition. An extra pressurizing step is necessary between both steps as there is a difference in pressure.

A similar method, but with both steps under the same pressure, is disclosed in U.S. Pat. No. 5,795,824 of NOVELLUS SYSTEMS, INC., San Jose, USA. After an initiation step by providing 15 to 75 sccm $SiH_4$ and 1000 sccm Ar, the tungsten deposition is carried out under a pressure from 5.33 to 10.67 kPa (40–80 Torr) during successively two deposition steps: a nucleation deposition by providing from 1000 to 15000 sccm $H_2$, from 50 to 800 sccm $WF_6$ and from 15 to 75 sccm $SiH_4$ and, in a different station, a bulk deposition by providing $WF_6$, $H_2$ and Ar gases, possibly in successive layers until the final thickness of tungsten.

All the above mentioned known methods with a reduction of tungsten hexafluoride in two steps are rather complicated and relatively slow, while a relatively complicated deposition system is required.

SUMMARY OF THE INVENTION

An object of the invention is to provide a method for tungsten chemical vapor deposition which is more simple and cheaper and has a higher deposition rate than the above mentioned prior art methods while a more simple deposition system may be used, and whereby the characteristics of the tungsten film such as the step coverage, the via resistance, the reflectivity etc. are at least equal to or better than these of a film obtained via the prior art methods.

According to the invention, this object is accomplished in a method for tungsten chemical vapor deposition on a semiconductor substrate, comprising positioning said substrate within a deposition chamber, heating said substrate and depositing under low pressure the tungsten on the substrate by contacting the latter with a mixture of gases flowing through the deposition chamber comprising tungsten hexafluoride ($WF_6$), hydrogen ($H_2$) and at least one carrier gas, characterized in that the mixture of gases comprises also silane ($SiH_4$) with such a flow rate that the flow ratio $WF_6/SiH_4$ is from 2.5 to 6, the flow rate of $WF_6$ being from 30 to 60 sccm, while the pressure in the deposition chamber is maintained from 0.13 to 5.33 kPa (I and 40 Torr).

It is amazing that by adjusting the flow ratio of $WF_6/SiH_4$, within the indicated pressure window, a 100% step coverage can be obtained.

Therefore, the tungsten deposition may be carried out in a single step.

Reaction efficiency is high, what results in high deposition rate and low gas consumption. Also the gas cost is low. There are less toxic gases and the overall quality of the tungsten film may be improved with respect to the prior art two step methods.

During the tungsten deposition, hydrogen is preferably supplied with a flow rate of 500 to 2000 sccm.

The temperature to which the substrate is heated depends amongst others on the chamber but is preferably situated between 400 and 495° C., but may be extended to lower temperatures, what however results in a lower deposition rate.

Carrier gases may be Ar and $N_2$ as in the prior art methods.

BRIEF DESCRIPTION OF THE DRAWINGS

The invention will now be described by way of example and with reference to the accompanying drawings in which.

DETAILED DESCRIPTION OF THE INVENTION

The deposition according to the invention of a tungsten (W) film on a substrate, more particularly a wafer 1 of semiconductor material, such as silicon, already covered with an insulating silicon oxide layer and an intermediate layer of TiN, is carried out in a commercially available chemical vapor deposition chamber 2 which is mounted in a deposition system.

Figure 1:
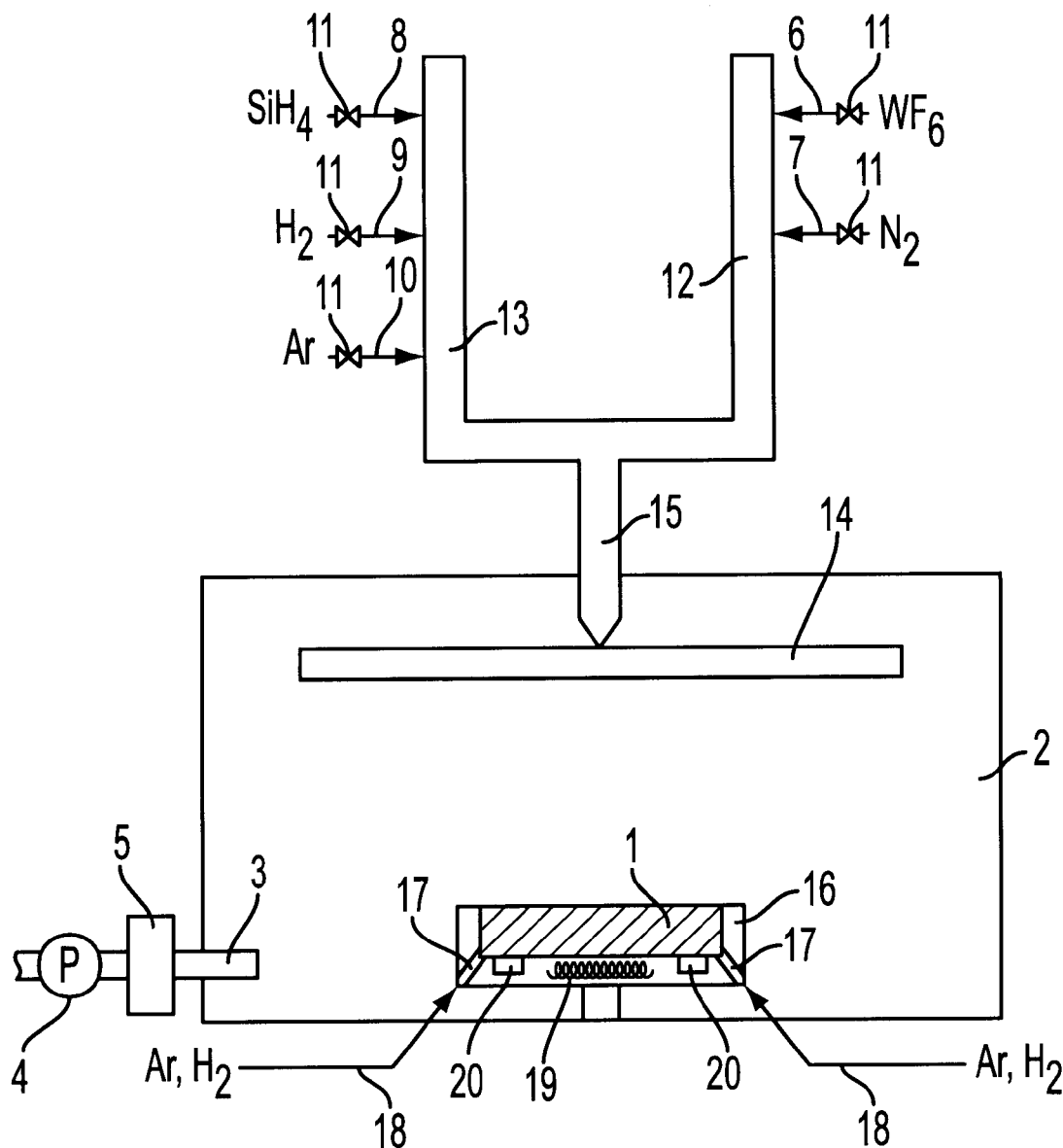
FIG. 1 schematically shows a deposition system for applying the method according to the invention.

FIG. 1 is a schematic representation of a typical existing one-chamber chemical vapor deposition system which may be used for applying the invention.

In this system, the deposition chamber 2 has a vacuum port 3 coupled to a vacuum pump 4 through a pressure control device 5.

The system comprises a number of supply lines 6–10 coupled to specific sources (not shown) for supplying respectively tungsten hexafluoride (WF6), reducing gas hydrogen ($H_2$), reducing gas silane ($SiH_4$), inert carrier gas argon (Ar), and carrier gas nitrogen ($N_2$). The flow rate of gas through these supply lines 6-10 is controlled by flow controllers 11.

In order to avoid reduction of the $WF_6$ outside the chamber 2, the supply lines 6 and 7 for $WF_6$ and the carrier gas $N_2$, respectively are coupled to a manifold 12, while the supply lines 8, 9 and 10 for $SiH_4$, $H_2$ and Ar, respectively are coupled to a second manifold 13. Both manifolds 12 and 13 supply a distribution head 14 inside the chamber 2 through a common gas line 15. Inside the deposition chamber 2, a support 16 having a bottom and upstanding edges is installed. Between the edges and the bottom, channels 17 may traverse the support 16, which channels 17 are connected to supply lines 18 for so-called edge gases, more particularly a mixture of controlled flow rates of $H_2$ and Ar, ensuring the same thickness of the tungsten film at the edges of the wafer 1 as in the center. A heating means 19, for instance a heating resistance, is incorporated in the support 16 for heating the wafer 1.

Figure 2:
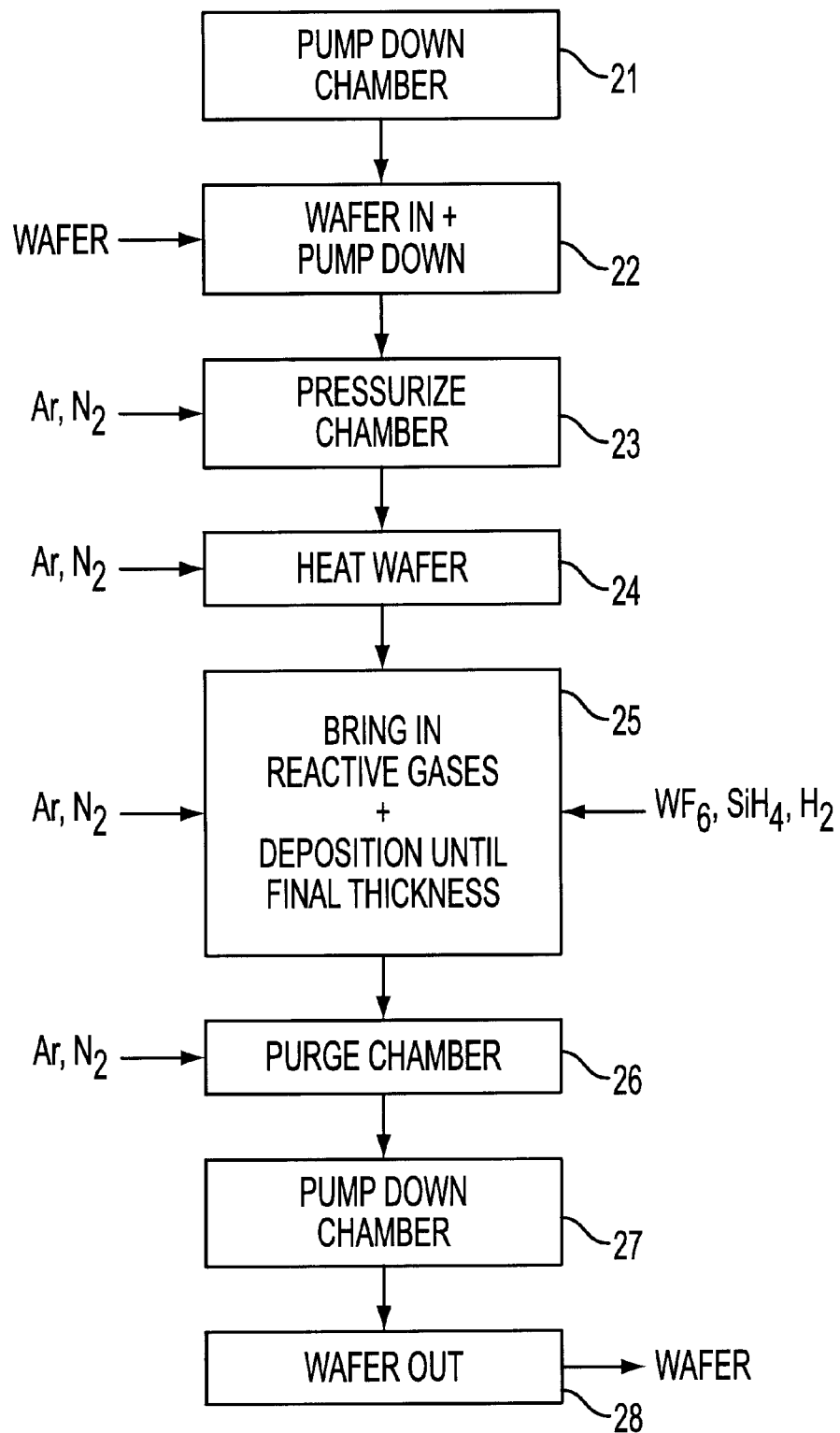
FIG. 2 shows a block diagram illustrating the steps of the method of the invention.

Turning to FIG. 2, the deposition of tungsten is carried out as follows:

In step 21, the chamber 2 is pumped down through the vacuum port 3 until a predetermined base pressure, which is for instance less than 0.003 kPa (20 milliTorr), and in step 22, a wafer 1 is placed on the support 16 inside the chamber 2, while the chamber 2 is further pumped down to said base pressure.

After this, in step 23, the chamber 2 is pressurized with inert gases Ar and $N_2$, provided through the lines 10 and 7, to a pressure from 0.13 kPa to 5.33 kPa (1 to 40 Torr) determined by the pressure control device 5.

As soon as the wafer I is placed on the support 16, it is heated to a temperature of 400 to 49520 C. due to its contact with the support 16 which has been heated to said temperature by the heating means 19. The heating has been indicated in FIG. 2 as step 24 but it is clear that heating starts already and could even be completed during step 23. In fact, the heating means 19 are activated from the start of the method and as long as wafers 1 are subsequently covered by a film of tungsten.

In a single step 25, a layer of W is deposited by opening the mass flow controllers 11 in the supply lines 6 and 7 so that $WF_6$ is mixed with a flow of $N_2$ in the manifold 12, while the flow controllers 11 in the supply lines 8, 9 and 10 are opened and $SiH_4$ and $H_2$ gases are mixed in the manifold 13 with a flow of Ar.

Consequently, a mixture of hydrogen Ar, $N_2$, $H_2$, $WF_6$ and $SiH_4$ is supplied through the common supply line 15 and the distribution head 14 to the chamber 2.

The mass flow controllers 11 determine the flow rate of the different gases. Flow rates of Ar and $N_2$ are not critical and Ar may for example be dispensed at flow rates from 800 to 3000 sccm and $N_2$ at flow rates from 10 to 400 sccm. These flow rates may be higher during the pressurization step 23 than during the deposition step. $WF_6$ is supplied with such flow rate that the ratio $WF_6/SiH_4$ is from 2.5 to 6, with a flow rate from 30 to 60 sccm.

These limits are important as a flow rate of $WF_6$ lower than 30 sccm results in a decreased step coverage, as well as a flow rate higher than 60 sccm causes a loss of reaction efficiency.

A flow ratio $WF_6/SiH_4$ below 2.5 results in a loss of step coverage, while a flow ratio above 6 results in an increase of stress, a drop in reflectivity, and a lower reaction efficiency. Too much $SiH_4$ will result in a $WF_6$ gradient in the hole or trench, decreasing the step coverage.

$H_2$ is supplied with a flow rate from 500 to 2000 sccm. This flow rate is not critical.

If, as shown, the support 16 is provided with channels 17, during step 25, an edge flow from 0 to 500 sccm $H_2$ added to a flow of Ar is supplied through these channels 17.

These flow rates are continuous and are maintained until the film of W has the required thickness. The gases which do not react on the wafer 1 are pumped away through port 3.

The pressure control device 5 ensures that the above mentioned pressure from 0.13 to 5.33 kPa, is maintained in chamber 2 during the deposition of W. These limits are critical since at a pressure lower than 0.13 kPa, the deposition rate will be too small, while at pressures higher than 5.33 kPa, gas nucleation will take place in the space above the wafer 1.

After the required thickness is obtained, the chamber 2 is purged in step 26 with Ar and $N_2$ gases, the flow rates of which may be higher than during the deposition step 25, after which the chamber 2 is pumped down in step 27.

Finally, in step 28 the wafer 1 is removed from the chamber 2.

The chamber 2 may again be purged with Ar and $N_2$ and is then ready to be pumped down for another depositing a W film on another wafer 1 and the above mentioned steps may be repeated.

By using the optimized $WF_6/SiH_4$ ratio, $WF_6$ gas flow and pressure, the step coverage is excellent, even for the steepest trenches and the deposition rate is almost doubled with respect of the know methods and being up to 643 nm/min.

The complete deposition of W takes places in one step. There is only one pressure during deposition and consequently no pressurizing step between depositions. Only one set of gas settings is required.

The flow rates of $WF_6$ and $SiH_4$ are critical and adjusted by relatively expensive mass flow controllers 11 which are difficult to calibrate. As the flow rate does not have to be changed during the tungsten deposition, one flow controller for each of these gases is sufficient. In the known two-step methods, two controllers are needed for the $WF_6$ as there is a low flow and a high flow, which is more expensive.

The invention will be further illustrated by the following practical example:

EXAMPLE

In a first step 21 the chamber 2 is pumped down to a pressure of 0.003 kPa (20 milliTorr), and again after a silicon wafer 1, having a layer of TiN previously formed thereon over an silicon oxide layer, is introduced in the CVD chamber 2 and placed on the support 16 which is maintained at a temperature of 475° C.

In a following step 23, the chamber 2 is pressurized at a pressure of approximately 4.00 kPa (30 Torr) by means of approximately 2800 sccm Ar and approximately 300 sccm N2.

The deposition itself is performed by supplying a flow rate of approximately 1000 sccm $H_2$, approximately 50 sccm $WE_6$ and approximately 15 sccm $SiH_4$ so that the ratio $WF_6/SiH_4$ is approximately 3.3, while maintaining a flow rate of approximately 800 scm Ar and approximately 300 sccm $N_2$.

A $H_2$ edge flow of approximately 50 sccm is supplied through channels 17 in order to obtain a more uniform tungsten film.

The chamber 2 is purged with 2500 sccm Ar and 300 scam $N_2$ and pumped down to a pressure of 0,003 kPa, and the wafer 1 is removed.

The deposition time was 60.2 s, compared to 78.0 s for a standard method with 30 sccm $WF_6$, 15 sccm $SiH_4$ and 1000 sccm $H_2$ at a pressure of 4.00 kPa (30 Torr) during nucleation and 95 sccm $WF_6$ and 700 sccm $H_2$ and no $SiH_4$ during bulk deposition. The $WF_6$ consumption was reduced with 30% with respect to said standard method. Stress and reflectivity were good.

Although no additional advantages could be found if a $SiH_4$ soak step is used, such step may be used between the step 23 and the depositing step 25.

Also a short pre-nucleation step may be added before the depositing step 25, possibly between the added soak step and the depositing step 25, by reducing during a few seconds, for example 1 to 7 seconds, the flow rate of $WF_6$ so that the flow ratio $WF_6/SiH_4$ is reduced to about 2, the other parameters remaining the same. This pre-nucleation step is much shorter, for example 1 to 7 seconds compared to the nucleation step in the known methods which take about 20 seconds.

It is also important to remark that the pressure during the pre-nucleation and the deposition step remains the same. Thereby an extra step is avoided resulting in a simple deposition system.

Additional experiments have been carried out to study the influence of different flow rates of the $WF_6$ and the $SiH_4$ flows, while at the same time varying the $WF_6/SiH_4$ ratio. Step coverage and growth rate were investigated. During these experiments $WF_6$ flow was varied between 20 and 60 sccm, and $SiH_4$ flow varied between 10 and 30 sccm. Pressure was kept at 4 kPa (30 Torr), deposition temperature was 475 degrees C., H2 flow was 1000 sccm and deposition time was 100 seconds.

Figure 3:
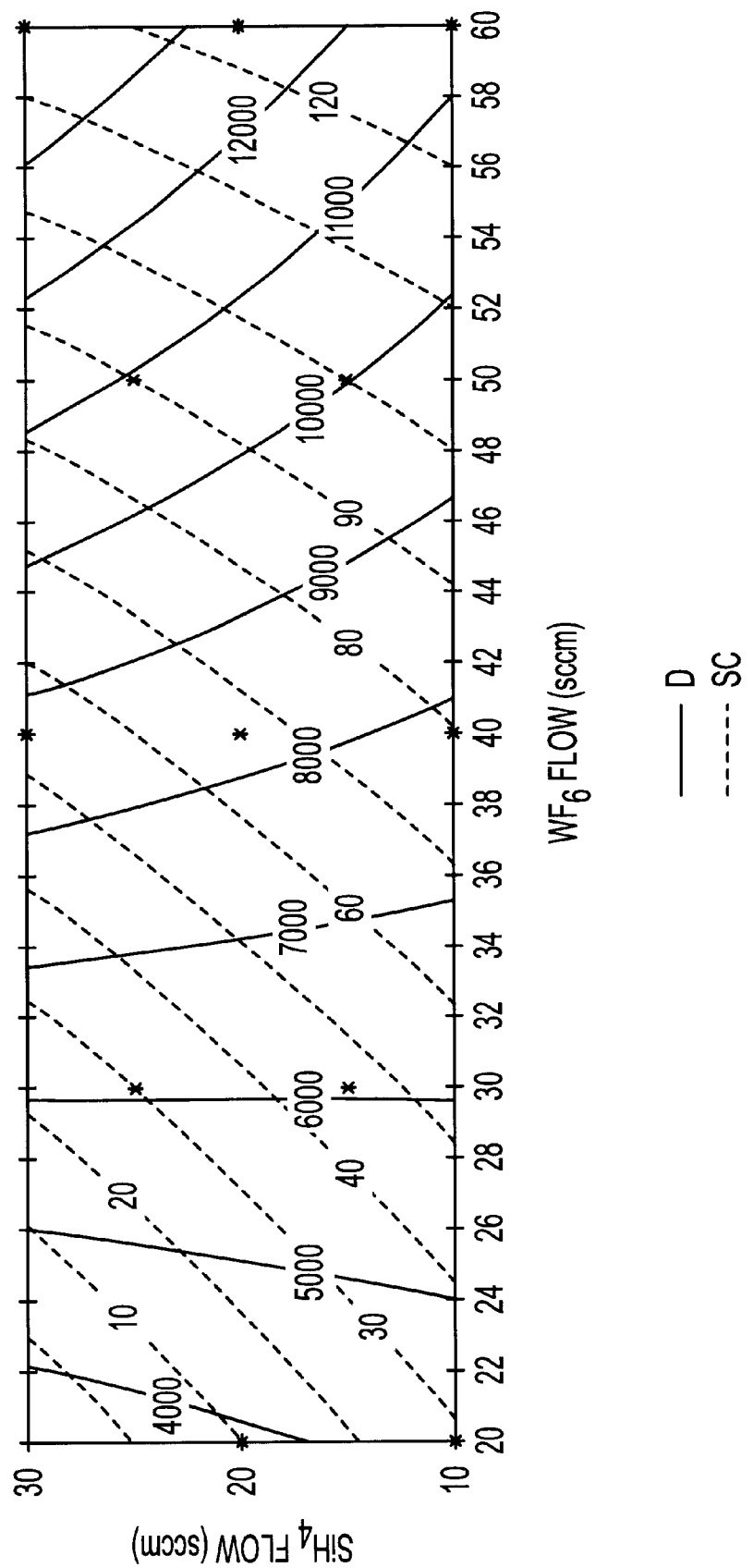
FIG. 3 shows experimental results of the thickness D and the step coverage SC, when varying the rates of the $SiH_4$ and $WF_6$ flows.
Figure 4:
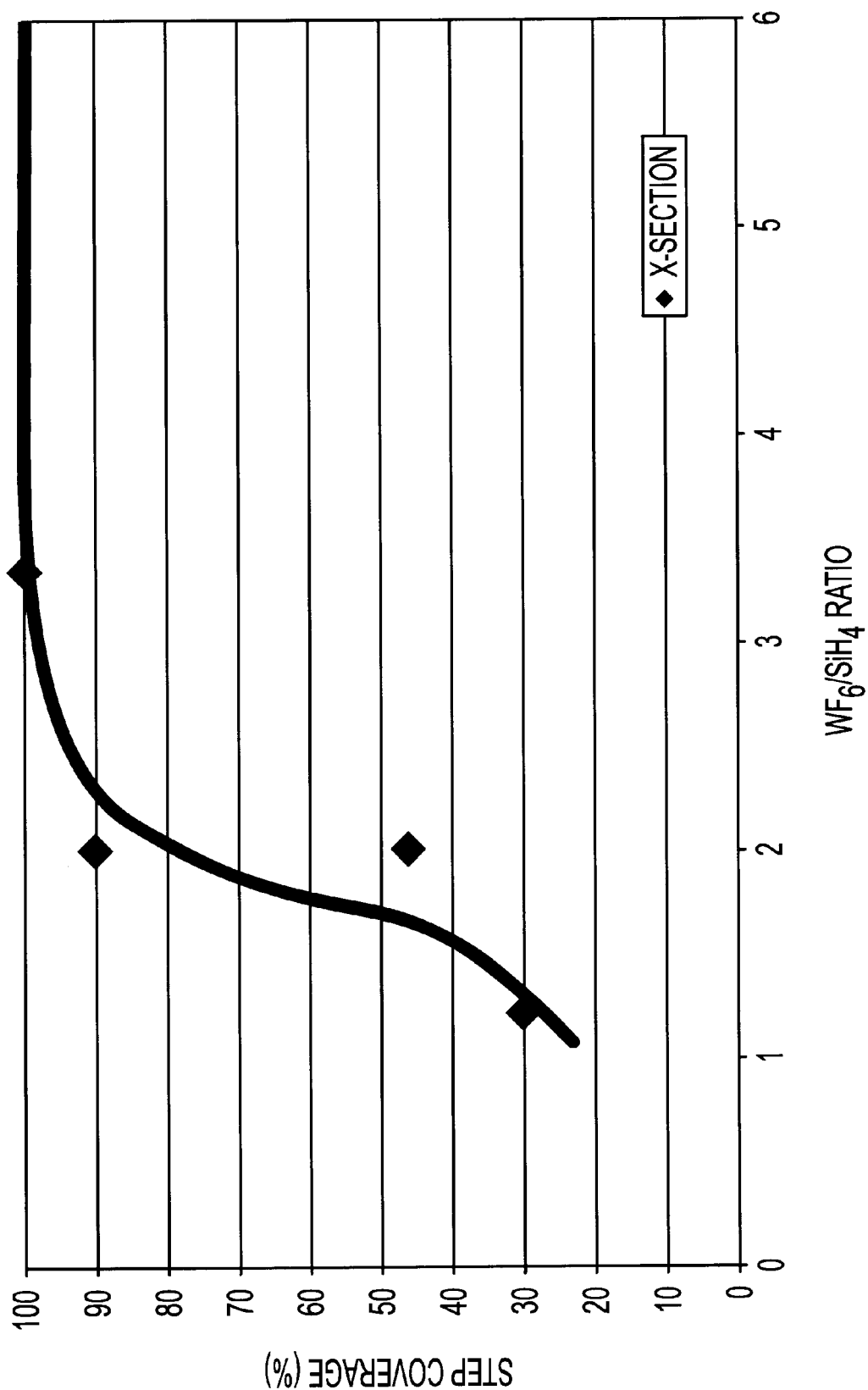
FIG. 4 shows experimental results of the influence of the $WF_6/SiH_4$ ratio on the step coverage of the deposited W layer.
Figure 5:
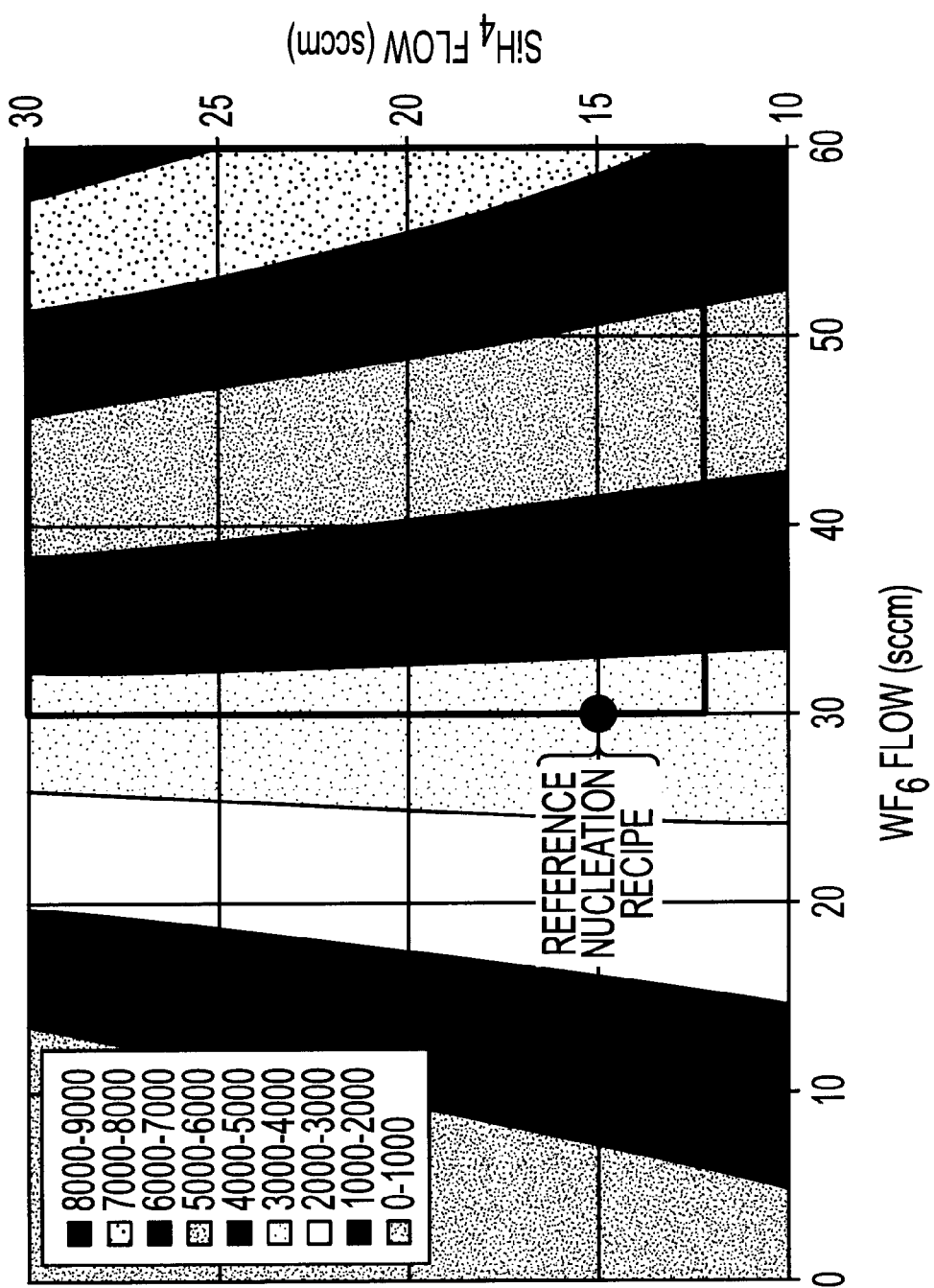
FIG. 5 shows experimental results, derived from FIG. 3, of the deposition rate, as a function of the $WF_6$ and $SiH_4$ flow rates.

Results are shown in FIGS. 3 to 5. In FIG. 3 layer thickness curves D, drawn in thin solid lines, and step coverage curves SC, drawn in thin dashed lines, are fitted through the measured results. These results are indicated with an asterisk. The influence of the $WF_6/SiH_4$ ratio on the step coverage is explicitly depicted in FIG. 4. From the latter figure it is clear that ratios lower than 2 result in a very bad step coverage, lower than 50%. Step coverage becomes excellent from ratios above 3.3.

The layer thickness D, shown in FIG. 3, is used for calculating the deposition rate, as shown in FIG. 5. Deposition rate is expressed in Angstrom/minute ($6.10^{-9}$ m/sec). Highest deposition rates are thus obtained with the highest flow rates. The deviation from literature can probably be caused by the mixed kind of chemistry used in these tests: $H_2/SiH_4/WF_6$, while in most cases only separate chemistries were used.

While the principle of the invention has been described above in connection with the described examples, it is to be clearly understood that this description is made only by way of example and not as a limitation on the scope of the invention.

What is claimed is:

1. Method for tungsten chemical vapor deposition on a semiconductor substrate (1), comprising positioning said substrate within a deposition chamber (2), heating said substrate (1) and depositing under low pressure the tungsten on the substrate by contacting the latter with a mixture of gases flowing through the deposition chamber (2) comprising tungsten hexafluoride ($WF_6$), hydrogen ($H_2$) and at least one carrier gas, characterized in that the mixture of gases comprises also silane ($SiH_4$) with such a flow rate that the flow ratio $WF_6/SiH_4$ is from 2.5 to 6, the flow rate of $WF_6$ being from 30 to 60 sccm, while the pressure in the deposition chamber is maintained from 0.13 to 5.33 kPa (1 and 40 Torr), wherein the complete tungsten deposition is carried out in a single step.

2. Method according to claim 1, characterized in that, during the tungsten deposition, hydrogen is supplied with a flow rate of 500 to 2000 sccm.

3. Method according to claim 1, characterized in that the temperature to which the substrate (2) is heated is situated between 400 and 495° C.

4. Method according to claim 1, characterized in that said at least one carrier gas comprises both Ar and $N_2$.

5. Method according to claim 1, wherein the flow ratio of $H_2/WF_6$ is from 16 to 30.

* * * * *